June 20, 1967 L. SICKLES II 3,327,133

ELECTRONIC SWITCHING

Filed May 28, 1963 2 Sheets-Sheet 1

INVENTOR.
LOUIS SICKLES II
BY
Eugene M. Whitacre
Attorney

INVENTOR.
LOUIS SICKLES II
BY Eugene M. Whitacre
Attorney 3,327,133

ELECTRONIC SWITCHING

Louis Sickles II, Philadelphia, Pa., assignor to Radio Corporation of America, a corporation of Delaware Filed May 28, 1963, Ser. No. 283,805
12 Claims. (Cl. 307—88.5)

This invention relates to electronic switching circuits, and more particularly to electronic switching circuits using semiconductor devices permissive of bidirectional current flow.

Bidirectionally conductive switching circuits have many useful applications in the electronics art, such as for example, in synchronous detector circuits, chopper circuits and in similar circuits where it is desirable to permit current flow in either direction through the switch when the switch is closed. Circuits have heretofore been proposed wherein a junction transistor is used as a bidirectionally conductive switching element with the desired signal information applied in series with the emitter-collector electrodes of the transistor and a switching voltage applied to the base electrode. One problem which has been encountered in such circuits is the contamination of the desired signal information by the switching voltage. The contamination includes a direct current (D-C) component developed across the base-emitter junction and an alternating current (A-C) component caused by switching currents flowing through the signal input and/or output circuits. Another problem encountered in switching circuits using junction transistors is that the range of desired signal amplitude for which the device exhibits linear characteristics is limited to a very small voltage.

It is therefore an object of this invention to provide an improved electronic switching circuit.

Another object of this invention is to provide an improved synchronous detector circuit using a bidirectionally conductive semiconductor device in which a desired message signal may be derived from a received transmission without contamination by the switching or sampling signal.

A further object of this invention is to provide an improved chopper circuit for converting a direct voltage to a modulated alternating voltage.

In accordance with the invention a signal input and output circuit are coupled to the drain and source electrodes of an insulated-gate field-effect transistor. Biasing means are provided for maintaining the source-to-drain path of the transistor in a first condition of operation, either conductive or nonconductive, in the absence of switching signal applied to the gate electrode. The term biasing means is intended to encompass a circuit including a transistor device which provides the desired condition of conduction for zero gate-to-source bias voltage. Switching circuit means is coupled between the gate electrode and at least one of the other electrodes, to provide a switching signal of a polarity and magnitude to change the conductivity of the source-to-drain path of the transistor to its opposite condition of conduction, i.e. from cutoff to conductive, or from conductive to cutoff depending on the quiescent biasing conditions.

In the case of a synchronous detector, or product detector, a source of signal waves to be demodulated and an output circuit are coupled between the source and drain electrodes, and a carrier wave is applied as a switching signal to the gate electrode of an insulated-gate field-effect transistor. By properly phasing the carrier wave relative to the applied signal wave, the desired modulating signal information can be derived from the output circuit. Since there is no polarizing or B+ voltage supply, there is no problem with supply voltage drift in the circuit. Furthermore, since the input resistance of an insulated-gate field-effect transistor is extremely high, substantially no current due to the regenerated carrier flows in the signal input or output circuits to produce contamination of the demodulated signal.

In the case of a chopper circuit for converting a direct voltage to a modulated alternating voltage, the direct voltage source and an output circuit are coupled in series between the source and drain electrodes of an insulated-gate field-effect transistor, and a periodic switching voltage is applied between the gate and source electrodes to chop the direct voltage. Due to the high gate-to-source impedance, there is substantially no contamination of the output signal by the switching voltage. Furthermore, since the gate is insulated from the source electrode, i.e. no rectifying junction exists between the gate and source electrodes, no offset voltage is introduced into the output circuit. In this regard, it should be noted that with junction transistors, the switching voltage causes a temperature responsive voltage to appear across the base-emitter junction, which junction voltage appears across the output circuit, even with zero direct voltage input signal. Heretofore, it has required two junction transistors connected in back-to-back relation to compensate for this offset voltage. A chopper circuit embodying the invention eliminates the offset voltage problem and provides excellent performance characteristics using only a single insulated-gate field-effect transistor device.

It has been found that insulated-gate field-effect devices exhibit a linear resistance over a large range of applied source-to-drain voltages as compared to junction transistors. Hence, the utility of switching circuits embodying the invention is not, as a practical matter, limited by the amplitude of the applied signal voltage which can be tolerated.

The novel features which are considered characteristic of the invention are set forth with particularity in the appended claims. The invention itself, however, both as to its organization and method of operation as well as addtional objects and advantages thereof will best be understood from the accompanying drawings in which:

Figure 1:
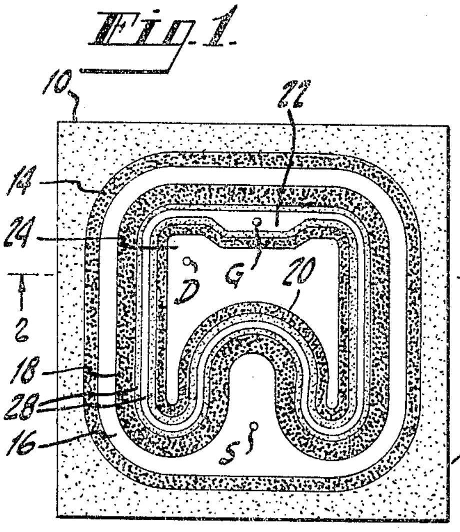
FIGURE 1 is a diagrammatic view of a field-effect transistor suitable for use in circuits embodying the invention.

Referring now to the drawings and particularly to FIGURE 1, a field-effect transistor 10 which may be used with circuits embodying the invention includes a body 12 of semiconductor material. The body 12 may be either a single crystal or polycrystalline and may be of any of the semiconductor materials used to prepare transistors in the semiconductor art. For example, the body 12 may be nearly intrinsic silicon, such as for example, lightly doped P-type silicon of 100 ohm/cm. material.

In the manufacture of a device shown in FIGURE 1, heavily doped silicon dioxide is deposited over the surface of the silicon body 12. The silicon dioxide is doped with N-type impurities. By means of a photo-resist and acid etching, or other suitable technique, the silicon dioxide is removed where the gate electrode is to be formed, and around the outer edges of the silicon wafer as viewed on FIGURE 1. The deposited silicon dioxide is left over those areas where the source-drain regions are to be formed.

Figure 2:
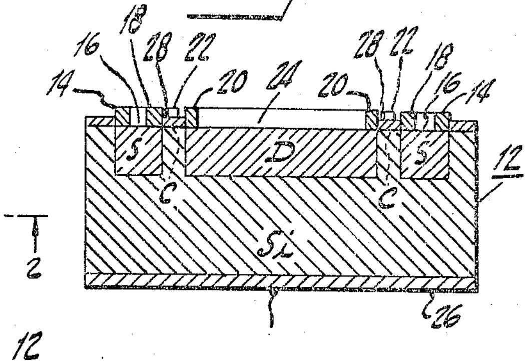
FIGURE 2 is a cross-sectional view taken along section line 2—2 of FIGURE 1.

The body 12 is then heated in a suitable atmosphere such as in water vapor so that exposed silicon areas are oxidized to form grown silicon dioxide layers indicated by the stippled areas of FIGURE 1. During the heating process, impurities from the deposited silicon dioxide layer diffuse into silicon body 12 to form the source and drain regions. FIGURE 2, which is a cross-section view taken along section line 2—2 of FIGURE 1, shows the source-drain regions labelled S and D respectively.

By means of another photo-resist and acid etching or like step, the deposited silicon dioxide over part of the source-drain diffused regions are removed. Electrodes are formed for the source, drain and gate regions by evaporation of a conductive material by means of an evaporation mask. The conductive material evaporated are chromium and gold in the order named, but other suitable electrically conductive material may be used.

The finished wafer is shown in FIGURE 1, in which the stippled area between the outside boundary and the first more darkly stippled zone 14 is grown silicon dioxide. The white area 16 is the metal electrode corresponding to the source electrode. Dark zones 14 and 18 are deposited silicon dioxide zones overlying the diffused source region, and the dark zone 20 is a deposited silicon dioxide zone overlying the diffused drain region. White areas 22 and 24 are the metallic electrodes which correspond to the gate and drain electrodes respectively. The stippled zone 28 is a layer of grown silicon dioxide on a portion of which the gate electrode 22 is placed and which insulates the gate electrode 22 from the substrate silicon body 12 and from the source and drain electrodes as shown in FIGURE 2. The input resistance of the device at low frequencies is of the order of $10^{14}$ ohms.

The layer of grown silicon dioxide 28 on which the gate electrode 22 is mounted, overlies an inversion layer or channel C of controllable conductively connecting the source and drain regions. The gate electrode 22 is displaced symmetrically between the source region S and the drain region D. If desired, the gate electrode 22 may be displaced towards the source region S and may overlap the deposited silicon dioxide layer 18.

It should be noted that electrodes D and S interchangeably operate as the drain and the source electrodes as a function of the polarity of the bias potential applied therebetween; i.e., the electrode to which a positive bias potential is applied (relative to the bias potential applied to the other electrode) operates as a drain electrode. The conduction of current through the channel C is by majority current carriers, in the present case electrons. If the device has an N-type substrate, and P-type source and drain regions, the majority current carriers are holes, and the electrode to which the negative terminal of a supply source is applied operates as the drain electrode.

Figure 3:
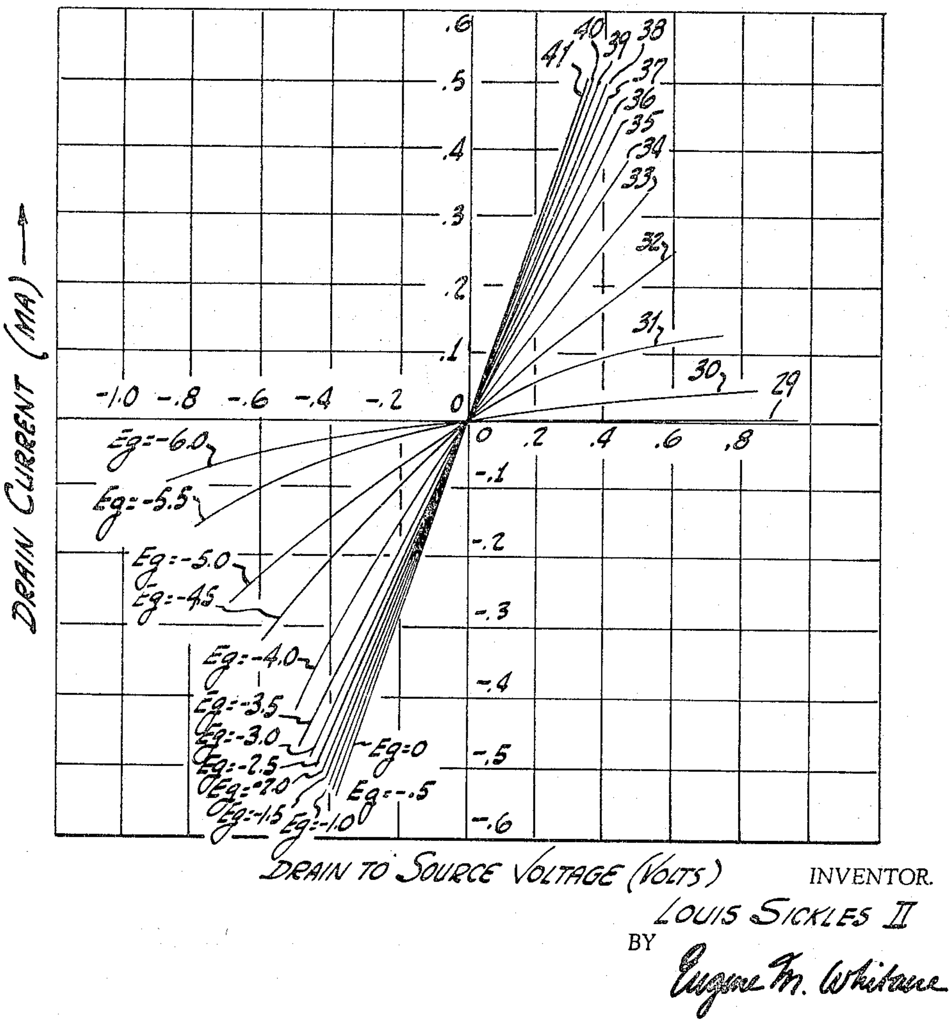
FIGURE 3 is a graph showing a family of drain current versus source-to-drain voltage curves for various values of gate-to-source voltages for the transistor of FIGURES 1 and 2.

The channel C, i.e., the source-to-drain current path, has controllable conductivity as shown by FIGURE 3 of the drawings. The conductivity of the channel C is a function of the amplitude and polarity of the gate-to-source bias voltage applied. FIGURE 3 is a family of curves 29–41 illustrating the linear portion below the knee of the drain current versus drain voltage characteristic of the insulated-gate field-effect transistor shown in FIGURE 1 connected in a common source configuration.

In order to more easily explain the conditions for obtaining the curves shown in FIGURE 3, one of the two electrodes will always be referred to as the drain electrode regardless of the polarity of the bias voltage applied thereto, and the other electrode will be referred to as the source electrode. The curves 29–41 shown in the first quadrant in FIGURE 3 were obtained by applying a bias potential to the drain electrode which is positive with respect to the potential of the source electrode, and by biasing the gate electrode with respect to the source electrode by a voltage having a magnitude as indicated by the voltage of $E_g$ (gate voltage) corresponding to each of the curves 29–41. The portion of the curves 29–41 corresponding to the third quadrant were obtained by reversing the polarity of the bias voltage applied between the source and drain electrodes, i.e., by applying a bias potential to the drain electrode which is negative with respect to the potential of the source electrode.

It should be noted that the drain current versus drain voltage characteristics shown in FIGURE 3 is substantially linear over a substantial range of drain voltages as compared to a bipolar or junction transistor. With a gate-to-source voltage corresponding to the curve 29, substantially no source-to-drain current flows, while a gate-to-source voltage corresponding to the curve 41, permits source-to-drain current as a linear function of applied source-to-drain voltage.

A feature of an insulated-gate field-effect transistor is that it can be manufactured so that the zero gate bias voltage characteristic is any one of the curves shown in FIGURE 3. In FIGURE 3, for example, the curve 41 corresponds to the zero bias voltage curve, as indicated by the notation $E_g=0$. The location of the zero bias curve is established during the manufacture of the transistor, e.g., by controlling the time and/or temperature of the step of the process when the silicon dioxide layer 28 shown in FIGURES 1 and 2 is grown. The longer the transistor is baked and the higher the temperature, in a dry oxygen atmosphere, the larger the drain current will be for a given amount of drain voltage at zero bias between the source and gate electrodes. Hence, if desired, the curve 29 could be made to correspond to the zero gate bias condition, with the curves 30–41 corresponding to progressively more positive gate voltages.

Figures 4, 5, 6, 7:
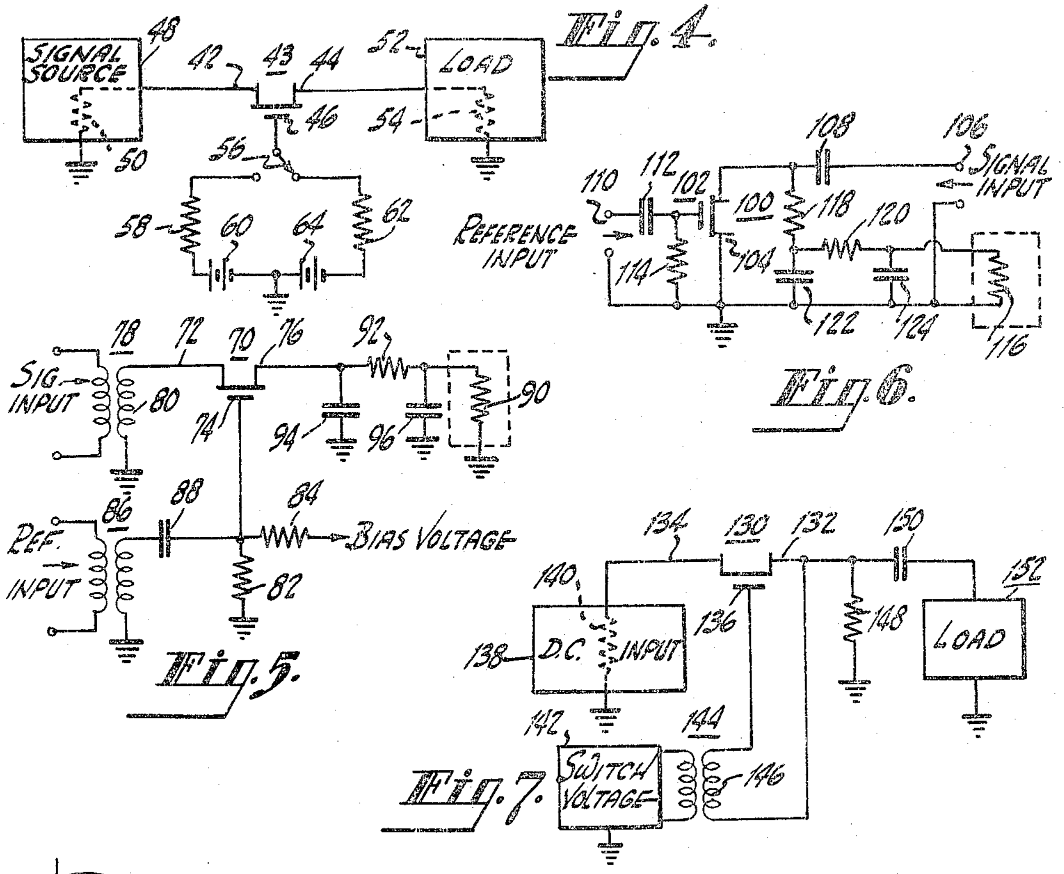
FIGURE 4 is a schematic circuit diagram of a switching circuit embodying the invention.
FIGURE 5 is a schematic circuit diagram of a synchronous detector circuit embodying the invention.
FIGURE 6 is a schematic circuit diagram of another synchronous detector circuit embodying the invention.
FIGURE 7 is a schematic circuit diagram of a chopper circuit embodying the invention.

Reference is now made to FIGURE 4 which is a schematic diagram of a switching circuit employing an insulated-gate field-effect transistor 43 of the general type described in FIGURES 1 and 2. The transistor 43 has a source electrode 42, a drain electrode 44, and a gate electrode 46. The source electrode 42 is connected to a source of signals 48 which has an internal resistance indicated by the resistor 50 effectively in circuit between the source electrode 42 and ground. The drain electrode 44 is connected to a load circuit 52 which has a resistance indicated by the resistor 54 which completes the drain circuit to ground.

The transistor 43 operates as a switch to connect and disconnect the signal source 48 from the load 52. To control the conductivity of the source-to-drain path of the transistor 43, a single-pole double-throw switch 56 is connected to the gate electrode 46, so that in a first position of the switch the gate is connected through a resistor 58 and a source of direct voltage, shown at a battery 60 to ground; and in a second position of the switch 56 (the position illustrated in the drawing), the gate electrode is connected through a resistor 62 and a source of potential, shown as a battery 64, to ground.

Assume that the transistor 43 has a zero bias gate voltage characteristic corresponding to one of the curves 33–37 of FIGURE 3. When the switch 56 is in its first position, the gate electrode 46 is maintained at a positive potential with respect to ground, and the device operates to provide a low source-to-drain resistance as indicated by the curve 41 of FIGURE 3. Under these conditions, current may flow in either direction between the signal source 48 and load 52. In addition, due to the very high D-C resistance between the source and gate electrodes, not only is there very little loading on the battery 60, but substantially no current from the battery 60 flows in the signal source or load circuits for any applied signal condition which would cause signal contamination.

When it is desirable to interrupt the circuit between the signal source 48 and load 52, the switch 56 is thrown to its second position, wherein the gate electrode 46 is held at a negative potential by the battery 64. The potential of the battery 64 is sufficiently negative that the source-drain path of the transistor 43 is cutoff and the device may be considered to be operating on the curve 29 of FIGURE 3.

If the transistor 43 has a zero bias gate voltage characteristic corresponding to the curve 41 of FIGURE 3, then the voltage supply source represented by the battery 60, and the resistor 58 can be eliminated and the left-hand stationary contact as viewed in FIGURE 4 of the switch 56 can be either directly grounded, or grounded through a direct current conductive impedance element such as a resistor or inductor. Alternatively, if the transistor 43 has a zero bias gate voltage characteristic corresponding to the curve 29 of FIGURE 3, then the battery 64, and resistor 62 can be eliminated, and the right-hand stationary contact as viewed in FIGURE 4 can be either directly grounded or grounded through a direct current conductive impedance element.

The principles of the invention are embodied in the synchronous detector circuit of FIGURE 5, wherein the conductivity of the field-effect transistor is switched electronically. Synchronous detectors, often referred to as product detectors, are useful for demodulating signal wave transmissions which include sideband information representative of two or more different message signals. Examples of such wave transmissions are suppressed carrier wave transmission, single or independent sideband transmission, quadrature sideband transmission and the like.

The synchronous detector circuit of FIGURE 5 includes an insulated-gate field-effect transistor 70 having a source electrode 72, a gate electrode 74 and a drain electrode 76. For the purposes of a generalized description it will be assumed that the transistor 70 has a zero bias gate electrode characteristic corresponding to the curve 33.

Signals from a suitable source, not shown, are applied to the primary winding of a transformer 78, and are coupled to a secondary winding 80 which connects the source electrode 72 to a point of reference potential, shown as ground. The gate electrode 74 is biased to cutoff by a voltage divider comprising a pair of resistors 82 and 84 connected between ground and the negative terminal of a direct voltage source. A reference signal source, not shown, which provides a voltage of the original carrier frequency is applied to the primary winding of a transformer 86. Where more than one message signal is contained in the sidebands of the signal being demodulated, the reference voltage phase is adjusted to provide the desired relation to the sideband energy for proper separation of the message signals. The reference voltage is applied to the gate electrode 74 through a coupling capacitor 88.

The drain electrode 76 is coupled to a suitable utilization or load circuit, represented by a resistor 90, through a low-pass filter circuit including a series resistor 92 and a pair of shunt capacitors 94 and 96.

The reference voltage applied to the gate electrode 74 is of sufficient amplitude to drive the transistor 70 to a conductive condition represented by the curve 41 of FIGURE 3. During this interval signal currents from the input circuit can flow to the load 90 in either direction through the transistor 70. It should be noted that there is no direct voltage polarizing supply required, and hence D-C stability problems associated with supply voltage drift, device aging and the like are not encountered. By properly controlling the phase of the reference signal applied to the gate electrode 74 with respect to the phase of the signals applied to the source electrode 72, the input signals are sampled in a manner to derive the desired message signal. The low-pass filter comprising the resistor 92 and capacitors 94 and 96 serve to filter R-F components of the applied signal from the desired modulation products. Due to the very high impedance between the gate electrode 74 and either of the source or drain electrodes 72 and 76 respectively, very little current from the reference signal source flows in the input of output circuits of the synchronous detector to produce contamination of the desired signal.

The angle of sampling of the input signal applied to the source electrode 72 can be controlled as a function of the bias voltage applied to the gate electrode 74. For example, as the negative voltage applied to the gate electrode 74 is increased, the angle of sampling of the input signal will be reduced, since a greater amount of the reference signal input swing will be required to overcome the increased reverse bias.

As mentioned above in connection with FIGURE 4, if the transistor 70 has a zero gate electrode bias characteristic corresponding to the curve 29 of FIGURE 3, the capacitor 88, the resistors 82 and 84, and the bias voltage supply can be eliminated and the secondary winding of the transformer 86 directly connected between the gate electrode 74 and ground.

A modification of the synchronous detector circuit wherein the signal input circuit and load circuit are connected in parallel between the source and drain electrodes of an insulated-gate field-effect transistor is shown in FIGURE 6. The circuit of FIGURE 6 includes an insulated-gate field-effect transistor 100 which may be of the general type as described in connection with FIGURES 1 and 2. The transistor 100 is presumed to have a zero bias gate electrode characteristic corresponding to the curve 41 of FIGURE 3. If desired, a suitable positive biasing potential may be provided to maintain the gate electrode 102 at a positive potential with respect to ground and the source electrode 104.

A signal input source, not shown, which has a high impedance relative to the minimum resistance exhibited between the source and drain electrodes of the transistor 100 is coupled to the input terminals 106. The input terminals 106 are capacitively coupled through a coupling capacitor 108 between the source and drain electrodes of the transistor 100. A reference input signal is applied to the terminals 110. The reference signals are coupled through a capacitor 112 and across resistor 114 connected between the gate electrode 102 and source electrode 104. An output or utilization circuit having a resistance represented by the resistor 116 is connected between the source and drain electrodes by way of a low-pass filter comprising a pair of series resistors 118 and 120 and a pair of shunt capacitors 122 and 124.

In operation, the transistor 100 serves as a switch to short out the signal applied to the terminals 106 except during the sampling interval. Accordingly, as the reference signal swings positively, the transistor 100 remains in its high conduction condition, and effectively shorts the input terminals. When the reference signal swings sufficiently negative to cutoff the transistor 100, the signal applied to the terminals 106 is fed to the output circuit, with the R-F components being filtered by the resistor 120 and capacitors 122 and 124.

FIGURE 7 is a schematic circuit diagram of a chopper circuit for converting a direct-voltage (slowly varying voltage) to an alternating voltage amplitude modulated as a function of the original direct voltage. The chopper circuit includes an insulated-gate field-effect transistor 130 having a source electrode 132, drain electrode 134 and gate electrode 136. A direct voltage source 138 is coupled to the drain electrode 134, with the internal resistance of the signal source 138, represented by the resistor 140, providing a D-C path between the drain 134 and a point of reference potential shown as ground.

Figure 8:
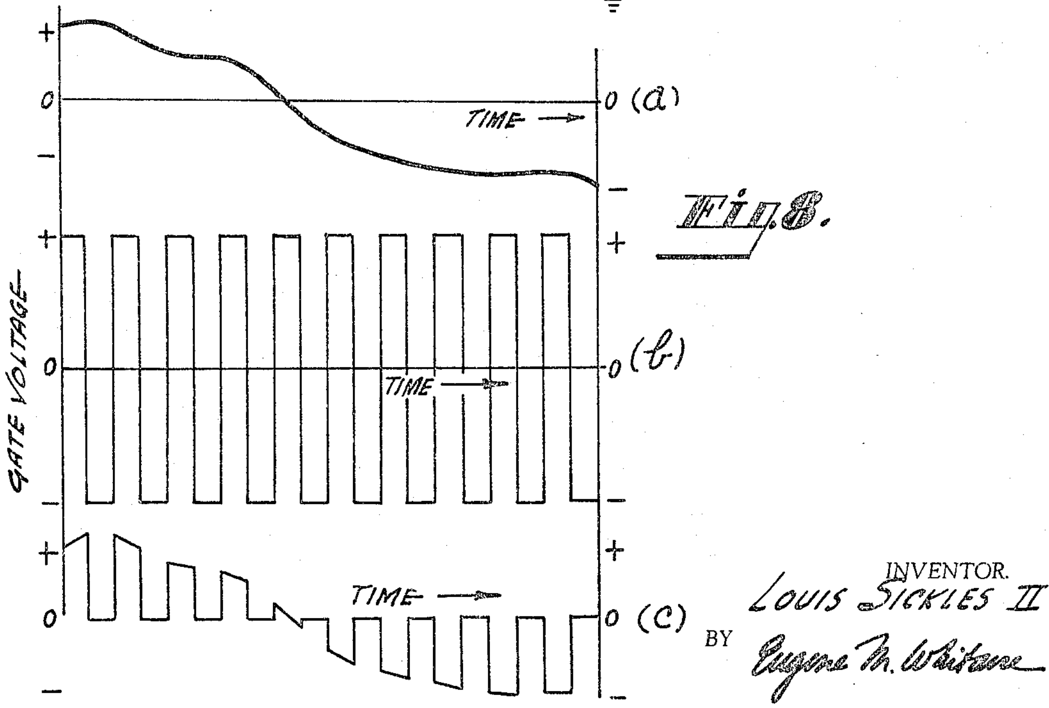
FIGURES 8*a*, 8*b* and 8*c* are graphs of voltage waveforms useful in explaining the operation of the chopper circuit of FIGURE 7.

A source of switching voltage 142 is coupled through a transformer 144, the secondary winding 146 of which is connected between the gate electrode 136 and the source electrode 132. The switching voltage comprises essentially a square voltage wave as shown in FIGURE 8, and may be coupled between the gate and either of the source and drain electrodes in any suitable manner.

A load resistor 148 is connected between the source electrode 132 and ground, and chopped signals developed thereacross are coupled by way of the capacitor 150 to a load circuit 152. The load circuit 152 may comprise an A-C amplifier of a kind known in the art, with means for synchronously demodulating the amplified A-C signal.

The operation of the chopper circuit of FIGURE 7 will be explained with reference to the graphs of FIGURES 8*a*, *b* and *c*. The graph of FIGURE 8*a* represents the slowly varying direct voltage from the D-C signal source 138 applied to the drain electrode 134. The graph of FIGURE 8*b* represents the switching or chopping voltage waveform from the switching voltage source 142 which is applied between the gate electrode 136 and source electrode 132. The graph of FIGURE 8*c* represents the resulant A-C signal which is developed across the resistor 148 and coupled to the load 152. It will be noted that the resultant A-C signal is a suppressed carrier amplitude modulated as a function of the slowly varying D-C voltage from the signal input source 138.

The switching voltage source 142 provides a signal of sufficient amplitude to drive the transistor 130 between cutoff and a relatively highly conductive condition. When the gate electrode 136 is positive relative to the source electrode 132, the transistor is conductive, and the voltage across the signal source 138 appears across the resistor 148. The resistance of the resistor 148 is made large relative to the minimum source-to-drain resistance of the transistor 130 to prevent excessive D-C signal voltage drop across the transistor. When the gate electrode 136 is driven negatively relative to the source electrode 132, the transistor 130 is cutoff, and the voltage across the resistor 148 is zero as shown in FIGURE 8*c*. The continuous or periodic chopping converts the direct voltage to an amplitude modulated A-C wave which can be amplified without severe drift problems in A-C amplifiers. It will be noted, that a reversal in polarity of the applied direct voltage as indicated by the right-hand portion of FIGURE 8*a* does not affect the operation of the circuit because of the bidirectional conduction capabilities of the transistor 130.

The chopper circuit of FIGURE 7 provides excellent operational characteristics without contamination of the chopped output signal developed across the resistor 148 by the switching voltage. As discussed hereinbefore, where junction transistors are used as choppers, the switching voltage developed across the emitter-base path of the transistor appears across the output resistor even with zero input voltage from the signal source. This undesired emitter-base voltage, which is known as an offset voltage, is temperature responsive, and must be compensated if the chopper is to provide acceptable operation. In the junction transistor art, two transistors were connected back-to-back, and simultaneously switched, to compensate for the offset voltage.

The chopper circuit of FIGURE 7 requires only a single insulated-gate field-effect transistor to provide contamination free chopping action. Since there is no rectifying junction between the gate electrode 136 and source electrode 132, the gate electrode can be driven either positive or negative relative to the source electrode without producing significant gate current. Accordingly, the power demand on the switching voltage source 142 is low. Furthermore, the high gate impedance permits flexibility of design, in that end of the secondary winding 146 can be disconnected from the source electrode 132 and connected to ground without introducing appreciable contamination of the output signal by the switching signal.

Although the circuits of FIGURES 4–6 have been described in connection with an insulated-gate field-effect transistor having a P-type semiconductor substrate, other types of insulated-gate devices may be used. For example, a complementary conductivity type device having an N-type semiconductor substrate may be used. Alternatively, other types of insulated-gate devices may also be used such as thin film devices formed on an insulating support.

What is claimed is:

1. Apparatus comprising:
   - a two terminal signal supply source, one terminal of which is connected to a point of reference potential;
   - a load;
   - means for translating signals from the other terminal of said signal supply source to said load with substantially zero direct voltage shift, said means including
   - a single insulated gate field effect semiconductor device having a bidirectional current path coupling said other terminal of said signal supply source and said load when in a first conductivity condition and uncoupling said other terminal of said source and said load when in a second conductivity condition;
   - and means coupled to said semiconductor device for controlling the conductivity of said bidirectional current path between said first and second conductivity conditions to control the coupling between said signal supply source and said load.

2. Apparatus as defined in claim 1 wherein one terminal of said load is connected to said point of reference potential and the bidirectional current path of said single insulated gate field effect semiconductor device is serially connected between said other terminal of said signal source and the other terminal of said load, and wherein said conductivity control means alternately renders said bidirectional current path conductive and non-conductive.

3. Apparatus as defined in claim 1 wherein said signal supply source and said load are coupled in parallel circuit relation, and wherein said conductivity control means alternately renders said bidirectional current path conductive and nonconductive.

4. An electronic switching system comprising:
   - a two terminal signal supply source, one terminal of which is connected to a point of reference potential;
   - a two terminal load, one terminal of which is connected to said point of reference potential;
   - means for translating signals from the other terminal of said signal supply source to the other terminal of said load with substantially zero direct voltage shift, said means including a single insulated gate field effect transistor having source, drain, and gate electrodes and a bi-directional source-drain current path of controllable conductivity, and wherein said other terminal of said supply source is connected to one of said source and drain electrodes and said other terminal of said load is connected to the other of said source and drain electrodes; and
   - means coupled between said gate electrode and one of said source and drain electrodes for supplying switching signals to said gate electrode for rendering said bidirectional current path alternatively in a relatively high conductivity condition and in a relatively low conductivity condition;

5. An electronic switching system as defined in claim 4 wherein said switching signal supply means is coupled between said gate electrode and said point of reference potential, and alternately applies a first voltage to said gate electrode with respect to said point of reference potential which is of a magnitude and polarity to render said bidirectional current path fully conductive and a second voltage to said gate electrode with respect to said point of reference potential which is of a magntiude and polarity to render said bidirectional current path nonconductive.

6. An electronic switching system as defined in claim 4 wherein said switching signal supply means is coupled between said gate electrode and one of said source and drain electrodes in a circuit which is exclusive of said signal supply source and said load.

7. An electronic switching system as defined in claim 4 wherein said insulated gate field effect transistor has a zero gate bias characteristic such that said bidirectional current path is substantially fully conductive.

8. An electronic switching system as defined in claim 4 wherein said insulated gate field effect transistor has a zero gate bias characteristic such that said bidirectional current path is substantially non-conductive.

9. A synchronous detector circuit comprising:
a two terminal source of signal wave energy containing modulation products to be detected, one terminal of which is connected to a point of reference potential;
a load circuit;
means for translating signals from the other terminal of said source of wave energy to said load circuit with substantially zero direct voltage shift, said means including a single insulated gate field effect transistor having source, drain and gate electrodes, wherein one of said source and drain electrodes is connected to said other terminal of said wave energy source and wherein said load circuit is connected between the other of said source and drain electrodes and said point of reference potential to form a series circuit with said source of wave energy between said source and drain electrodes;
and means coupled between said gate electrode and said point of reference potential for supplying reference signals related in phase and frequency to said wave energy to said gate electrode.

10. A synchronous detector circuit comprising:
a two terminal source of signal wave energy containing modulation products to be detected, one terminal of which is connected to a point of reference potential;
a load circuit;
means for translating signals from the other terminal of said source of wave energy to said load circuit with substantially zero direct voltage shift, said means including a single insulated gate field effect transistor having source, drain and gate electrodes, wherein one of said source and drain electrodes is connected to said other terminal of said wave energy source and wherein said load circuit is connected between said one of said source and drain electrodes and said point of reference potential to form a parallel circuit with said source of wave energy;
and means coupled between said gate electrode and said point of reference potential for supplying reference signals related in phase and frequency to said wave energy to said gate electrode.

11. An electronic chopper circuit comprising:
a source of low frequency signal voltage to be chopped, having a pair of terminals;
a load element having a pair of terminals;
means for translating signal voltages from one terminal of said source to one terminal of said load element with substantially zero direct voltage shift, said means including a single insulated gate field effect transistor having source, drain, and gate electrodes and a bidirectional source-drain current path of controllable conductivity coupled between said one terminal of said source and said one terminal of said load element;
means connecting the other of said pair of terminals of said source of signal voltage and said load element, and
means coupled between said gate electrode and one of said source and drain electrodes for supplying chopping voltage signals to said gate electrode of sufficient magnitude to alternately render the source-to-drain current path of said transistor conductive and non-conductive.

12. An electronic chopper circuit as defined in claim 11 wherein said means for supplying chopping signals is coupled between said gate electrode and one of said source and drain electrodes in a circuit path which is exclusive of said source of signal voltage and said load element.

References Cited

UNITED STATES PATENTS

| | | | |
|---|---|---|---|
| 2,744,970 | 5/1956 | Shockley | 307—88.5 |
| 2,900,531 | 8/1959 | Wallmark | 307—88.5 |
| 2,939,916 | 6/1960 | Miller | 307—88.5 X |
| 3,018,391 | 1/1962 | Lindsay et al. | 307—88.5 |
| 3,191,061 | 6/1965 | Weimer | 307—88.5 |
| 3,202,840 | 8/1965 | Ames | 307—88.5 |

OTHER REFERENCES

Amelco Semiconductor pamphlet, "Field Effect Transistors," No. 1, June 1962 (7 pages), (page 7 relied on).

Bright: "Junction Transistors Used as Switches," A.I.E.E. Trans. on C.+E., 3–1955, Part. 1, vol. 74, No. 1 (pp. 111 to 121), (p. 115 relied on).

Weimer: "The TFT . . . ," Proceedings of the IRE, June 1962 (pages 1462 to 1469), (pages 1462 and 1564 relied on).

ARTHUR GAUSS, *Primary Examiner.*

DAVID J. GALVIN, JOHN W. HUCKERT, *Examiners.*

D. D. FORRER, *Assistant Examiner.*